United States Patent
Schell et al.

(10) Patent No.: US 7,535,071 B2
(45) Date of Patent: May 19, 2009

(54) SYSTEM AND METHOD OF INTEGRATING OPTICS INTO AN IC PACKAGE

(75) Inventors: Steve Schell, Arcadia, CA (US); Robert Witman, Pasadena, CA (US); Joe Brown, Valencia, CA (US)

(73) Assignee: Evolution Robotics, Inc., Pasadena, CA (US)

( * ) Notice: Subject to any disclaimer, the term of this patent is extended or adjusted under 35 U.S.C. 154(b) by 373 days.

(21) Appl. No.: 11/090,432

(22) Filed: Mar. 25, 2005

(65) Prior Publication Data

US 2005/0212929 A1    Sep. 29, 2005

Related U.S. Application Data

(60) Provisional application No. 60/557,252, filed on Mar. 29, 2004, provisional application No. 60/602,238, filed on Aug. 16, 2004.

(51) Int. Cl.
*H01L 31/113* (2006.01)

(52) U.S. Cl. .............................. 257/434; 257/E31.122; 257/680; 257/681; 348/230.1; 348/345; 250/203.5

(58) Field of Classification Search .......... 257/E31.122, 257/E31.117, 434, 680, 681; 235/454–546, 235/380; 250/203.3, 203.5; 702/150; 348/230.1, 348/345, 349, 354, 340, 294
See application file for complete search history.

(56) References Cited

U.S. PATENT DOCUMENTS

| 5,024,529 | A   | * | 6/1991  | Svetkoff et al. | ............. 356/608 |
| 6,587,573 | B1  | * | 7/2003  | Stam et al.     | ................... 382/104 |
| 7,148,458 | B2  | * | 12/2006 | Schell et al.   | ............. 250/203.3 |
| 2003/0024986 | A1 | * | 2/2003 | Mazz et al.    | ................. 235/454 |
| 2003/0146384 | A1 | * | 8/2003 | Logsdon et al. | .......... 250/338.1 |

* cited by examiner

*Primary Examiner*—Chris C. Chu

(57) ABSTRACT

An apparatus and method of integrating optics into an IC package is for detecting light from at least one light source is disclosed. The apparatus has a housing, which has a predetermined spectral transmittance. A sensor is positioned within the housing. An opaque mask is applied to the housing, where the opaque mask has a hole aligned with the sensor such that the light's centroid is detected by the sensor. In one embodiment, the apparatus further comprises a substrate for positioning and stabilizing the sensor in the housing, an analog filter and amplification module ("AFA") for filtering and amplifying signals from the sensor and generating a second signal, and a digital signal processor ("DSP") for generating a coordinate system by extracting frequency components from the AFA output signal.

14 Claims, 2 Drawing Sheets

SYSTEM AND METHOD OF INTEGRATING OPTICS INTO AN IC PACKAGE

RELATED APPLICATIONS

This application claims the benefit under 35 U.S.C. § 119(e) of U.S. provisional applications No. 60/557,252, filed Mar. 29, 2004 and No. 60/602,238, filed Aug. 16, 2004, the entirety of which is hereby incorporated by reference.

Appendix A, which forms a part of this disclosure, is a list of commonly owned co-pending U.S. patent applications. Each one of the co-pending applications listed in Appendix A is hereby incorporated herein in its entirety by reference thereto.

FIELD OF THE INVENTION

The present invention relates generally to a system and method of detecting light sources using position-sensitive detectors ("PSD"), segmented photodiodes, or other imagers, and more particularly relates to a system and method of facilitating the detection of light sources on a sensor in order to estimate the position, orientation or pose of a mobile object.

ART BACKGROUND

It is well known to use photo sensors such as position-sensitive detectors ("PSD"), or photo arrays, to detect a light source for applications such as image cameras, spot light detection, pointing devices for computers, or position measurement. What has challenged the designers, however, is the optical lens which is needed to produce a focused light spot on the photo sensors. An optical lens, as can be appreciated by those skilled in the art, is a delicate, expensive component. The conventional approach is that to achieve useful detection, a focused image of light sources in the environment needs to be projected by an optical lens onto the light sensitive surface of the sensor. For example, in a digital camera, a focused image of an object has to be projected through the optical lens onto the imaging sensors in the camera, where the image sensors may be a charge-coupled device or CMOS imager. If the image is not focused, the camera would produce a blurry image of the object. For such applications, a good quality optical lens is an indispensable element.

For some applications, however, optical lenses present more challenges to the designers than solutions. A slight defect or error in quality, manufacture or implementation, on the part of the optical lens, would compromise its performance, thus rendering the image, or information, useless. To replace the optical lens would incur additional cost, both in labor and parts, which hurts the bottom line.

For other applications, the delicate and expensive optical lens would seem to present an over-engineered solution, since the projection of a somewhat out-of-focus image can still be sufficient, and sometimes essential. In such cases, sharp focusing of the image is actually not necessary. While the sensor of such applications is still position-sensitive, it is not an array of small pixels, as in the case of a conventional imager or camera. Rather, the sensor may possess continuous position sensitivity across its monolithic surface, or the sensor may be comprised of large magnitude sensitive segments. Here, the goal is not to obtain a precise, focused image of the object on the sensor. Rather, it is to obtain a sufficiently focused image, or even a sufficient, yet unfocused, image, to enable the detection of the centroid of the source. In some cases, the correct performance of the sensor depends on having the image of the light source spread across more than one segment of the sensor, thus rendering precise focusing disadvantageous. Under these circumstances, the more expensive optical lenses, which are required for digital cameras or imaging applications, have proved to be less desirable.

Additionally, in some weak signal environments, it is desirable to have a large entrance pupil diameter ("EPD") on the lens, so as to increase the signal-to-noise ratio. An exemplary weak signal environment is one, as described in the co-pending patent applications, which uses reflected light sources to estimate the position and orientation of a mobile robot. Such an environment also calls for a wider field of view ("FOV"), so that the light sources can be observed from a variety of angles. As one skilled artisan can appreciate, the EPD and FOV turn out to be two conflicting goals: the gain in one dictates a compromise in the other.

Therefore, it would be desirable to have an optical system that can provide an optimized EPD and FOV combination.

It is also desirable to have an optical system that can be implemented with low-cost manufacturing processes and inexpensive components, without the need for precision manufacturing.

SUMMARY OF THE INVENTION

An apparatus and method of integrating optics into an IC package is for detecting light from at least one light source is disclosed. The apparatus has a housing, which has a predetermined spectral transmittance. A sensor is positioned within the housing. An opaque mask is positioned on the outside or inside of the housing, where the opaque mask has a hole aligned with the sensor such that the light can be detected by the sensor. In one embodiment, the apparatus further comprises a substrate for positioning and stabilizing the sensor in the housing, an analog filter and amplification module ("AFA") for filtering and amplifying signals from the sensor and generating the AFA output signal, and a digital signal processor ("DSP") for generating a coordinate system by extracting frequency components from the AFA output signal.

DETAILED DESCRIPTION OF THE DRAWINGS

A system and method of integrating optics into IC package is disclosed. The system and method can be used in a variety of applications where one or more light sources are projected onto a sensor through an optical lens. The general methods and system for position estimation using reflected light sources have been disclosed in the co-pending patent applications. The description that follows will elaborate on the system and method of integrating optics into the IC package for detection and processing of the position, orientation and pose information. As described in the co-pending applications, a light source can be a light having a variety of wavelengths, such as visible, or infrared.

Figure 1:
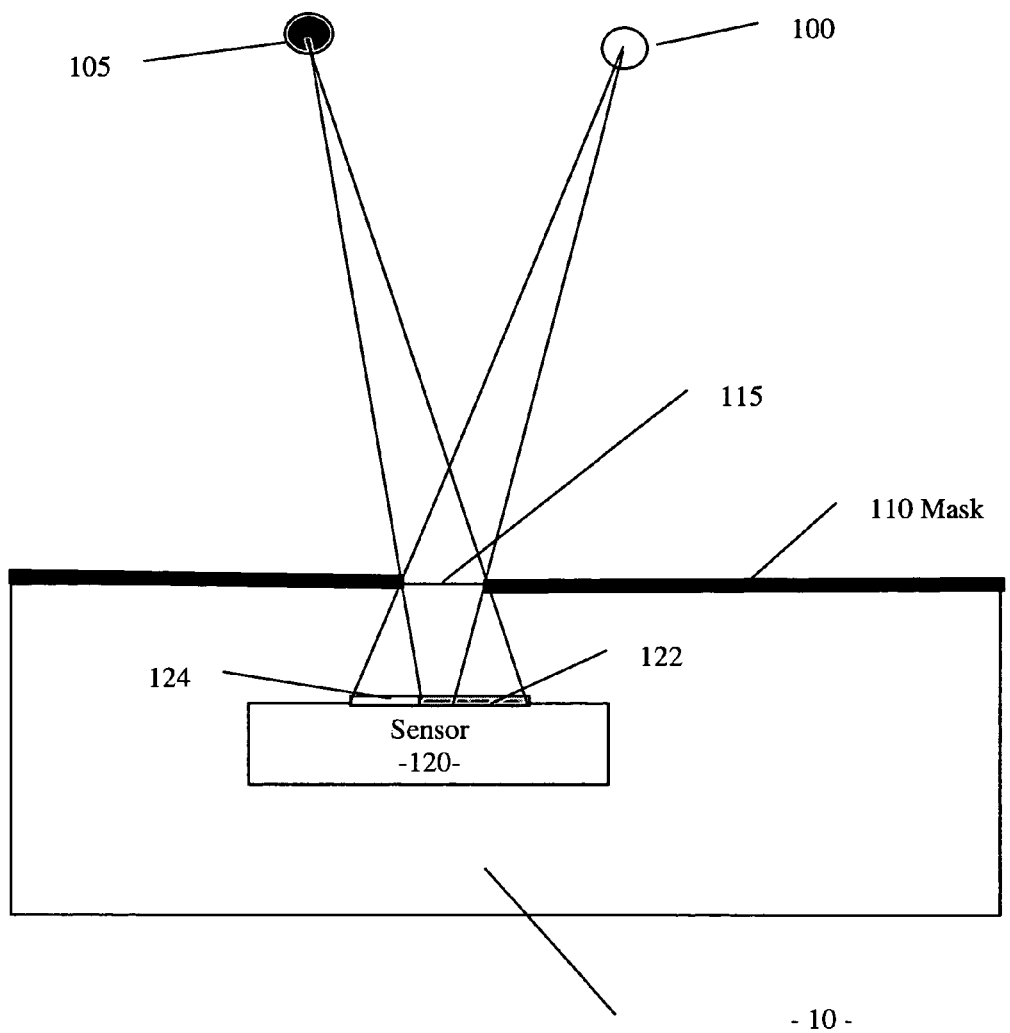
FIG. 1 is a simplified drawing of an exemplary integrated circuit ("IC") package 10 with an integrated mask 110.

Reference is first made to FIG. 1, where a simplified drawing of an exemplary IC package 10 with a mask 110 is illustrated. As described in the co-pending patent applications, the light sources 100, 105 represent fixed landmarks for the position sensor 120 to detect. The sensor 120 is positioned in an IC package 10, which is transparent to the light from the light sources 100, 105. An opaque mask 110 with an aperture 115 is applied to the IC package 10, such that the opaque mask 110 is positioned within the optical path formed between the light sources 100, 105 and the sensor 120. For example, the opaque mask 110 may be implemented on the outside surface of the IC package 10, or implemented within the IC package 10. The aperture 115 can be a tiny spot on the mask 110 that is open or non-opaque, or can be an aperture through the mask 110. The transparent material of the IC package 10 can be a resin that is cast or injection-molded around the sensor 120. There are many commercially available materials suitable for this purpose, one exemplary material of which is polycarbonate resin. Preferably, the transparent material has a spectral transmittance, such that it minimizes or eliminates unwanted light sources from the optical path of the sensor 120, while being "transparent" to the desired light sources 100, 105. For an infrared ("IR") light source(s) used in the exemplary embodiment, it would be preferable to use a visible light-cutting filter material for the resin. In other words, the resin is opaque to the unwanted wavelengths of light (such as visible wavelengths), but is transparent to the desired wavelength of the light source(s) (such as IR). Also, as can be appreciated, the transparent material serves to stabilize and secure the sensor 120 and the optical path formed thereof.

The opaque mask 110 can be applied to the top of the IC package 10 using various readily achievable methods. For example, the mask 110 can be painted, printed, or applied as a plastic film onto the transparent IC package 10. On the mask 110, an aperture 115 is formed, which is about 2 mm×2 mm in area for the exemplary embodiment. It should be noted that the dimension of the aperture 115 is specific to the actual embodiment contemplated by one skilled in the art. The aperture 115 is preferably aligned with the image sensor 120 in its optical path, such that the light sources 100, 105 can be observed by the sensor 120, through the transparent material of the IC package 10, as much as possible.

As can be appreciated, the aperture 115 and the transparent material of the IC package 10 allow the light sources 100, 105 to project light spots 122, 124, respectively, onto the sensor 120. As described in the aforementioned section, the light spots 122, 124 allow the sensor 120 to detect their centroidal positions and intensities, or magnitudes. Such detection can generally take place when the light spots are not "focused", and in some cases, such as when the sensor 120 is a segmented photo-diode, such detection requires that the light spots be somewhat "out of focus". As the mobile unit on which the sensor 120 sits moves around, the intensity and centroidal positions of the light spots 122, 124 will change accordingly. Based on the coordinate transformation illustrated in the co-pending patent applications, the position, orientation and pose of the mobile unit on which the sensor 120 sits can be estimated. When multiple light sources, and multiple light spots, are provided, the position of each of the light spots in the sensor coordinate system can be estimated. As such, the pose of a mobile object, which corresponds to six degrees of freedom (6 DOF), can be estimated after the positions of the multiple light spots are determined in the sensor coordinate system.

It should be noted that the position-sensitive sensor 120 may be either a monolithic device or an array of similar or identical devices, acting as a single photo-sensitive transducer, which produces analog electrical signals representative of the position of the center of gravity of light incident on the photo-sensitive surface of the transducer. The position-sensitive light sensor may comprise a list of devices, including without limitation, PSDs, quad photodiodes, array of photodiodes, etc.

The distance from the aperture 115 to the sensor 120 can be optimized by controlling the height, or thickness, of the transparent material of the IC package 10. In this way, the field of view ("FOV") of the sensor can be controlled. Also, the spectral transmittance characteristics can be controlled by introducing additives into the transparent material of the IC package 10.

Figure 2:
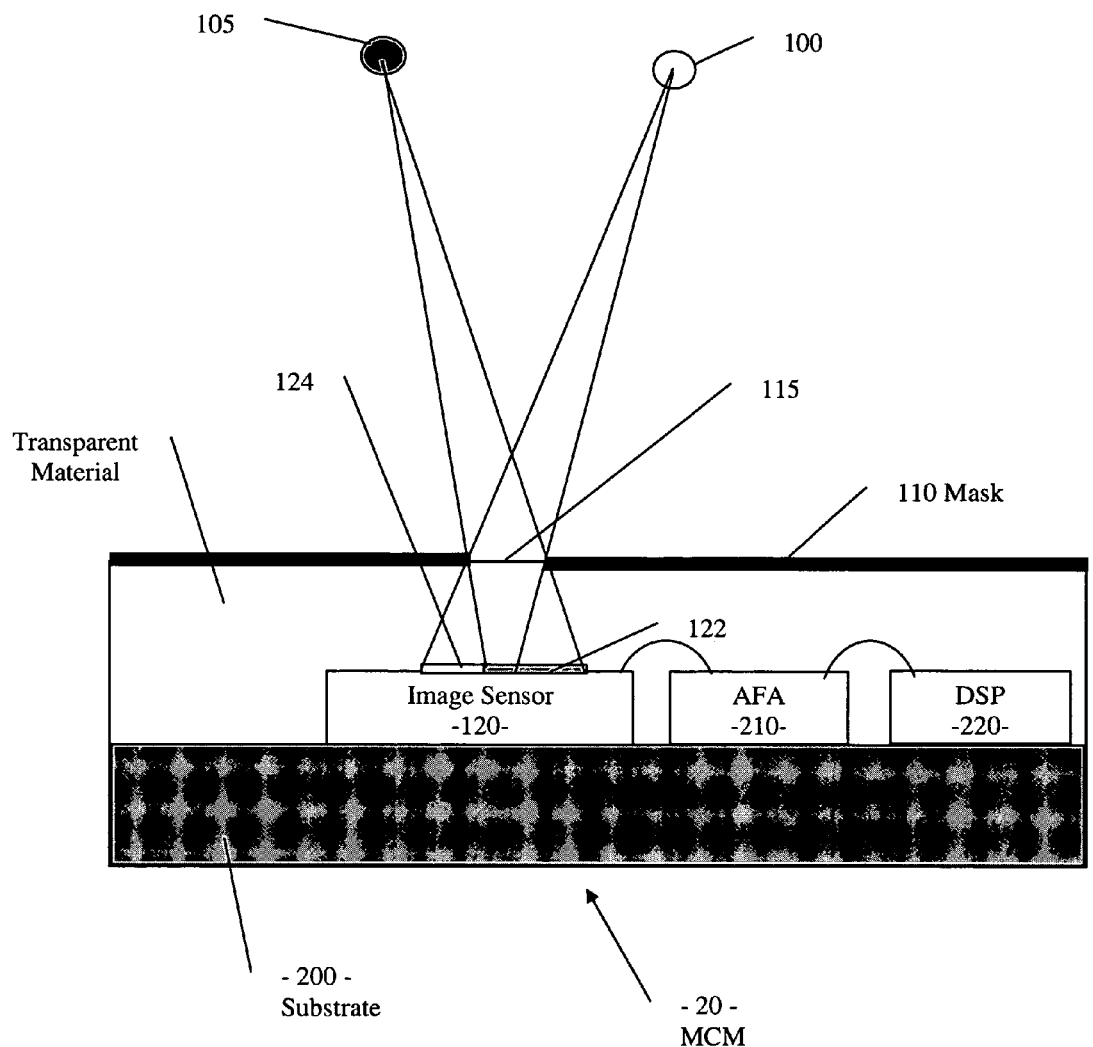
FIG. 2 is a simplified drawing of an exemplary package in a multi-chip module 20.

The sensor 120 enclosed in the transparent IC package 10 can be further operationally connected to other discrete components, for example, an analog filters/amplifiers module ("AFA") 210 and a digital signal processor ("DSP") 220, as illustrated in the co-pending patent applications and FIG. 2 herein. As illustrated in FIG. 2, these components can all be integrated as a multi-chip module ("MCM") 20, connected via wire bond techniques or various other kinds of bonding and connection techniques to the substrate or to the wafer, with the transparent material encapsulating or comprising the case of the MCM 20. The MCM 20, which is well known to those skilled in the art of semiconductor processing and packaging technology, may include an application-specific integrated circuit ("ASIC"), which integrates the aforementioned analog filter/amplifier and DSP, on a substrate.

It is also noted that while reference is generally made to a DSP in the present disclosure, it should be apparent to those skilled in the art that any "digital numerical processor" would work just as well. For example, the "digital numerical processor" may comprise a microprocessor, a DSP, an FPGA, a central-processing unit, or any combination thereof. The selection and implementation of a suitable processor would largely depend on the specific design of the system incorporating the present invention.

In contrast to the conventional approach of using an optical lens, this embodiment of the invention allows the optics, formed by the aperture and transparent material, to be integrated with the sensors, using low-cost methodology and components. The use of a delicate, expensive optical lens is thus avoided. In its place is an inexpensive, highly fault-tolerant aperture and optical path, which achieves the desired imaging performance. The resulting MCM package 20 can be manufactured using well-established semiconductor processing technology on a substrate 200, further driving down the cost of the components.

Although this invention has been described with reference to these specific embodiments, the descriptions are intended to be illustrative of the invention and are not intended to be limiting. Various modifications and applications may occur to those skilled in the art without departing from the true spirit and scope of the invention.

Appendix A

Incorporation by Reference of Commonly Owned Applications

The following patent applications, commonly owned and filed on the same day as the present application, are hereby incorporated herein in their entirety by reference thereto:

| Title | Application No. and Filing Date | Attorney Docket No. |
|---|---|---|
| "Methods And Apparatus For Position Estimation Using | Provisional application Ser. No. 60/557,252 | EVOL.0050PR |

-continued

| Title | Application No. and Filing Date | Attorney Docket No. |
|---|---|---|
| Reflected Light Sources" | Filed Mar. 29, 2004 | |
| "Circuit for Estimating Position and Orientation of a Mobile Object" | Provisional application Ser. No. 60/602,238 Filed Aug. 16, 2004 | EVOL.0050-1PR |
| "Sensing device and method for measuring position and orientation relative to multiple light sources" | Provisional application Ser. No. 60/601,913 Filed Aug. 16, 2004 | EVOL.0050-2PR |
| "System and Method of Integrating Optics into an IC Package" | Provisional application Ser. No. 60/602,239 Filed Aug. 16, 2004 | EVOL.0050-3PR |
| "Methods And Apparatus For Position Estimation Using Reflected Light Sources" | Utility application Ser. No. TBD Filed Mar. 25, 2005 | EVOL.0050A |
| "Circuit for Estimating Position and Orientation of a Mobile Object" | Utility application Ser. No. TBD Filed Mar. 25, 2005 | EVOL.0050A1 |
| "Sensing device and method for measuring position and orientation relative to multiple light sources" | Utility application Ser. No. TBD Filed Mar. 25, 2005 | EVOL-0050A2 |

We claim:

1. A multi-chip module ("MCM") for detecting at least one light source, comprising:
    an integrated package that is essentially transparent relative to the wavelength of said light source;
    a substrate mounted within said n integrated package;
    a sensor, mounted on said substrate within said n integrated package;
    an opaque mask, coupled to said integrated package, said opaque mask having an aperture formed thereon, wherein an optical path is formed from said light source to said sensor through said opaque mask;
    an analog filter and amplification module ("AFA") coupled to said integrated package, said AFA being disposed to filter and amplify signals from said sensor and generate a second signal; and
    a digital signal processor ("DSP") coupled to said integrated package and said AFA, said DSP being adapted to generate a coordinate system by extracting frequency components from said second signal.

2. The MCM of claim 1, wherein said aperture has a dimension of 2 mm by 2 mm.

3. The MCM of claim 1, wherein said sensor is a position-sensitive detector ("PSD").

4. The MCM of claim 3, wherein said integrated package is formed by a resin that is essentially transparent to the wavelength of interest, and has a predetermined spectral transmittance profile.

5. The MCM of claim 4, wherein said aperture is formed by an area on said opaque mask that is transparent to said light source.

6. The MCM of claim 4, wherein said integrated package is made of a transparent material with a predetermined spectral transmittance.

7. The MCM of claim 3, wherein said integrated package is made of a transparent material with a predetermined spectral transmittance.

8. The MCM of claim 1, wherein said sensor is a segmented photo-diode ("SPD").

9. The MCM of claim 8, wherein said integrated package is formed by a resin that is essentially transparent to the wavelength of interest, and has a predetermined spectral transmittance profile.

10. The MCM of claim 1, wherein said integrated package is formed by a resin that is essentially transparent to the wavelength of interest, and has a predetermined spectral transmittance profile.

11. The MCM of claim 1, wherein said aperture is formed by an area on said opaque mask that is transparent to said light source.

12. The MCM of claim 1, wherein said integrated package is made of a transparent material with a predetermined spectral transmittance.

13. The MCM of claim 1, said AFA further comprises:
    a transimpedance amplifier ("TIA"), being disposed to amplify signals from said sensor and remove DC components from the sensor signals to generate its output;
    a first passive high-pass filter ("$1^{st}$ PHP"), said $1^{st}$ PHP being disposed to remove DC bias from the output of said TIA and generate its output;
    a passive notch filter ("PNF"), disposed to remove noise signals between predetermined ranges of frequencies from the output of said 1.sup.st PHP and generate its output;
    a second passive high-pass filter ("$2^{nd}$ PHP"), being disposed to remove DC bias from the output of said PNF and generate its output;
    a gain amplifier, coupled to said $2^{nd}$ PHP, being disposed to amplify the output from said 2.sup.nd PHP and generate its output;
    a passive low-pass filter ("PLP"), being disposed to remove signals above a predetermined frequency from the output of said gain amplifier and generate its output.

14. The MCM of claim 1, wherein said DSP extracts said frequency components by using one of following filters: Goertzel algorithm, FFT, DFT, FIR and IIR.

* * * * *